United States Patent [19]
White et al.

[11] 4,166,985
[45] Sep. 4, 1979

[54] INJECTION LASER STABILIZATION

[75] Inventors: Brian R. White; David R. Smith, both of Woodbridge, England

[73] Assignee: The Post Office, London, England

[21] Appl. No.: 831,860

[22] Filed: Sep. 9, 1977

[30] Foreign Application Priority Data

Sep. 14, 1976 [GB] United Kingdom ............... 38054/76

[51] Int. Cl.² .............................................. H01S 3/13
[52] U.S. Cl. ........................... 331/94.5 S; 331/94.5 H
[58] Field of Search ...................... 331/94.5 S, 94.5 H; 307/312

[56] References Cited

U.S. PATENT DOCUMENTS

| 3,898,583 | 8/1975 | Shuey | 331/94.5 S |
| 3,946,335 | 3/1976 | De Loach, Jr. et al. | 331/94.5 S |
| 3,996,526 | 12/1976 | d'Auria et al. | 331/94.5 S |
| 4,092,614 | 5/1978 | Sakuma et al. | 331/94.5 H |
| 4,092,615 | 5/1978 | Shimizu | 331/94.5S |

OTHER PUBLICATIONS

Wittke et al., "Stabilization of CW Injection Lasers" *RCA Technical Notes*, Apr. 1975, pp. 1-3.

*Primary Examiner*—James W. Davie
*Attorney, Agent, or Firm*—Kemon and Estabrook

[57] ABSTRACT

Apparatus for stabilizing the output characteristics of an injection laser has a device for producing an electrical pulse train representative of an optical pulse train of the laser. The electrical pulse train is fed to circuitry which monitors the switch-on delay of the laser and controls the bias current of the laser such that the switch-on delay is maintained constant. Alternatively the pulse length can be monitored. The pulse amplitude or mean pulse energy can also be monitored and maintained constant.

13 Claims, 4 Drawing Figures

INJECTION LASER STABILIZATION

This invention relates to the stabilisation of the optical output characteristics of an injection laser.

Semiconductor injection lasers (e.g. gallium arsenide lasers) have been proposed for use in optical communication systems to convert either digital or analogue electrical signals into optical signals. A problem in such applications is that the output characteristics of a semiconductor laser change with temperature and passage of time. The output characteristics which can vary include:

$I_q$ the laser threshold current, $(dP/dI)\ I > I_q$, the efficiency $\alpha$ when the current applied to the laser is greater than the threshold current, and $(dP/dI)\ I < I_q$, the efficiency $\beta$ when the current applied to the laser is less than the threshold current. Where P is the optical output power of the laser and I the current applied to the laser.

In addition there is a switch-on time delay for lasing action between the application of the input modulating current and the appearance of the optical output pulse when the bias current $I_b$ applied to the laser is below the threshold current $I_q$.

The switch-on- delay (td) can be approximately represented by the equation $$td = \tau ln\left[\frac{I_m}{I_m + I_b - I_q}\right]$$

where $I_m$ is the modulating current
$I_b$ is the bias current
$I_q$ is the threshold current
and $\tau$ is the carrier lifetime (typically of the order of 1 ns to 4 ns).

There are three main requirements for an optical pulse from the source in an optical communication system. These are: (a) a constant pulse energy, (b) a constant pulse amplitude profile, and (c) a low extinction ratio (x) where x is the ratio of average power in an all "O"'s condition to average power in an all "I"'s condition.

The first requirement is the most important, the second is necessary to maintain correct equalisation, and the third can be a problem if the d.c. bias is not maintained below threshold and if there is a limit to the peak optical output power. When the d.c. bias is not maintained below threshold and if there is a limit to the peak optical output power. When the d.c. bias is maintained below threshold the switch-on delay causes a shortening of the optical output pulses which means that requirements (a) and (b) are not perfectly satisfied. A reduction of optical output pulse duration can be critical in high-bit rate systems.

We propose to operate a laser with its d.c. bias close to threshold and to control the d.c. bias such that the optical output pulse width or the switch-on delay is maintained substantially constant. We also propose to monitor the optical pulse amplitude or the mean optical pulse power and to control the drive pulses of the laser in such a way that the monitored parameter is maintained substantially constant.

According to one aspect of the present invention there is provided apparatus for stabilising output characteristics of an injection laser, said apparatus comprising first means for producing an electrical pulse train representative of an optical pulse train emitted by said laser, second means arranged to receive said electrical pulse train and to compare a signal indicative of the duration of the pulses of said train with a fixed duration reference signal to produce a control signal, and means for feeding the control signal to d.c. bias control means of the laser, the d.c. bias control means being responsive to said control signal to adjust the d.c. bias level such that the optical output pulses of the laser have a fixed duration.

The second means may be arranged to produce a signal indicative of the difference in duration between the pulses of said electrical pulse train and the pulses of the laser drive pulse train, and means for comparing the duration of said signal with that of said reference signal to produce said control signal whereby the optical output pulses are maintained constant by maintaining constant a predetermined delay between the start of each input pulse and the start of its corresponding output pulse. The first means may be a photodiode.

The second means may include an exclusive OR gate responsive to said electrical pulse train and said drive pulse train to produce said difference signal. The second means may include a fixed width pulse generator which is responsive to said drive pulse train to produce said reference signal. The fixed width pulse generator may be a monostable multivibrator.

The apparatus may include integration means for integrating the input to said comparing means.

The apparatus may include a feedback loop from said first means to pulse current circuitry for controlling the amplitude of said drive pulses, said feedback loop including a detector for detecting the amplitude of output pulses from said first means and a comparator for comparing a voltage corresponding to the detected amplitude with a reference voltage, said comparator output being connected to said pulse current circuitry, the arrangement being such that the comparator output signal is used to control the pulse current circuitry to stabilise the amplitude of the output pulses of the laser. Alternatively the apparatus may include a feedback loop from said first means to pulse current circuitry for controlling said drive pulses, said feedback loop including a detector for detecting the mean energy of the output pulses from said first means and a comparator for comparing a voltage corresponding to the detected energy with a reference voltage, said comparator output being connected to pulse current circuitry, the arrangement being such that the comparator output signal is used to control the pulse current circuitry to stabilise the mean energy of the output pulses of the laser.

According to another aspect of the present invention there is provided a method for stabilising output characteristics of an injection laser comprising deriving an electrical pulse train representative of an optical pulse train emitted by said laser, comparing a signal indicative of the duration of the pulses of said train with a fixed duration reference signal to produce a control signal, and controlling the d.c. bias applied to said laser by said control signal in such a manner that the duration of said optical output pulses is maintained constant. The signal may represent the difference in duration between a pulse of the electrical pulse train and a pulse of the drive pulse train of the laser.

The method may include the steps of detecting the amplitude or mean energy of pulses in said electrical pulse train, comparing the detected amplitude or mean energy with a reference signal to produce a feedback signal for controlling pulse current circuitry of the laser whereby the amplitude or mean energy of the optical output pulses is maintained constant.

According to a further aspect of the present invention there is provided a control system for stabilising output characteristics of an injection laser, said system including two feedback loops, first means common to the loops for producing an electrical pulse train representative of an optical pulse train emitted by the laser, the first loop further including second means arranged to receive said electrical pulse train and to compare a signal indicative of the duration of said pulses with a fixed duration reference signal to produce a control signal, and means for feeding the control signal to d.c. bias control means of the laser, the d.c. bias control means being responsive to said control signal to adjust the d.c. bias level such that the optical output pulses of the laser are of a fixed duration; said second loop further comprising a detector for detecting either the amplitude or mean energy of the output pulses from said first means and control means responsive to said detector output to control the pulse current drive circuitry of the laser such that the amplitude or mean energy of the optical output pulses is maintained constant.

The invention will be described now by way of example only with reference to the accompanying drawings in which.

Figure 1:
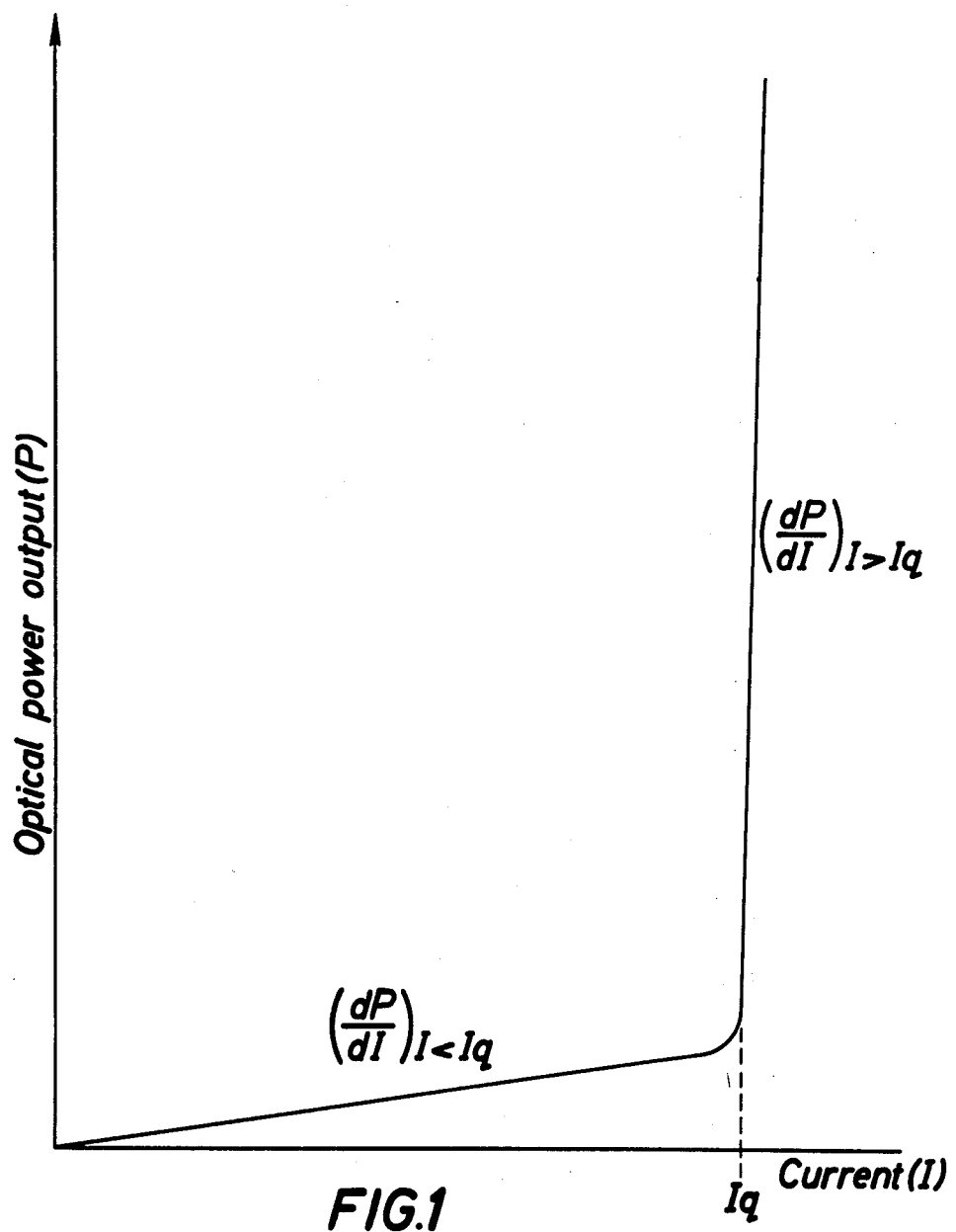
FIG. 1 is a graph illustrating the variation of optical power output with current for an injection laser.

The characteristics of an injection laser which can vary with temperature and time include the laser threshold current $I_q$, the efficiency $(dP/dI)$ $I > I_q$, and the efficiency $(dP/dI)$ $I < I_q$. These characteristics are illustrated in FIG. 1 of the drawings. In addition there is a switch-on time delay for lasing action between the application of an input modulating current to the laser and the appearance of the output of light from the laser when the bias current applied to the laser is below the threshold current $I_q$. The switch-on delay $t_d$ can be approximately represented by the following equation:

$$td = \tau ln\left[\frac{I_m}{I_m + I_b - I_q}\right]$$

where $I_m$ is the modulating current $I_b$ is the bias current $I_q$ is the threshold current and $\tau$ is the carrier lifetime (typically in the order of 1 nS to 4 nS).

Thus the switch-on delay will vary with variation in the threshold current of the laser. This can be important since, although it may be desirable to bias the laser below the threshold current (for digital systems), the switch-on delay may represent a limitation in the speed of operation of the laser. The switch-on delay is of importance when the laser is used in optical communication systems to transmit information in digital form. The switch-on delay can be important in such systems when it becomes significant compared to the shortest desired input pulse duration.

We propose to operate the laser below but close to threshold and to control the d.c. bias by monitoring the switch-on delay or output pulse duration and to adjust the d.c. bias such that the output pulse duration remains constant. By operating the laser close to threshold the switch-on delay is small in comparison with the pulse duration.

Figure 2:
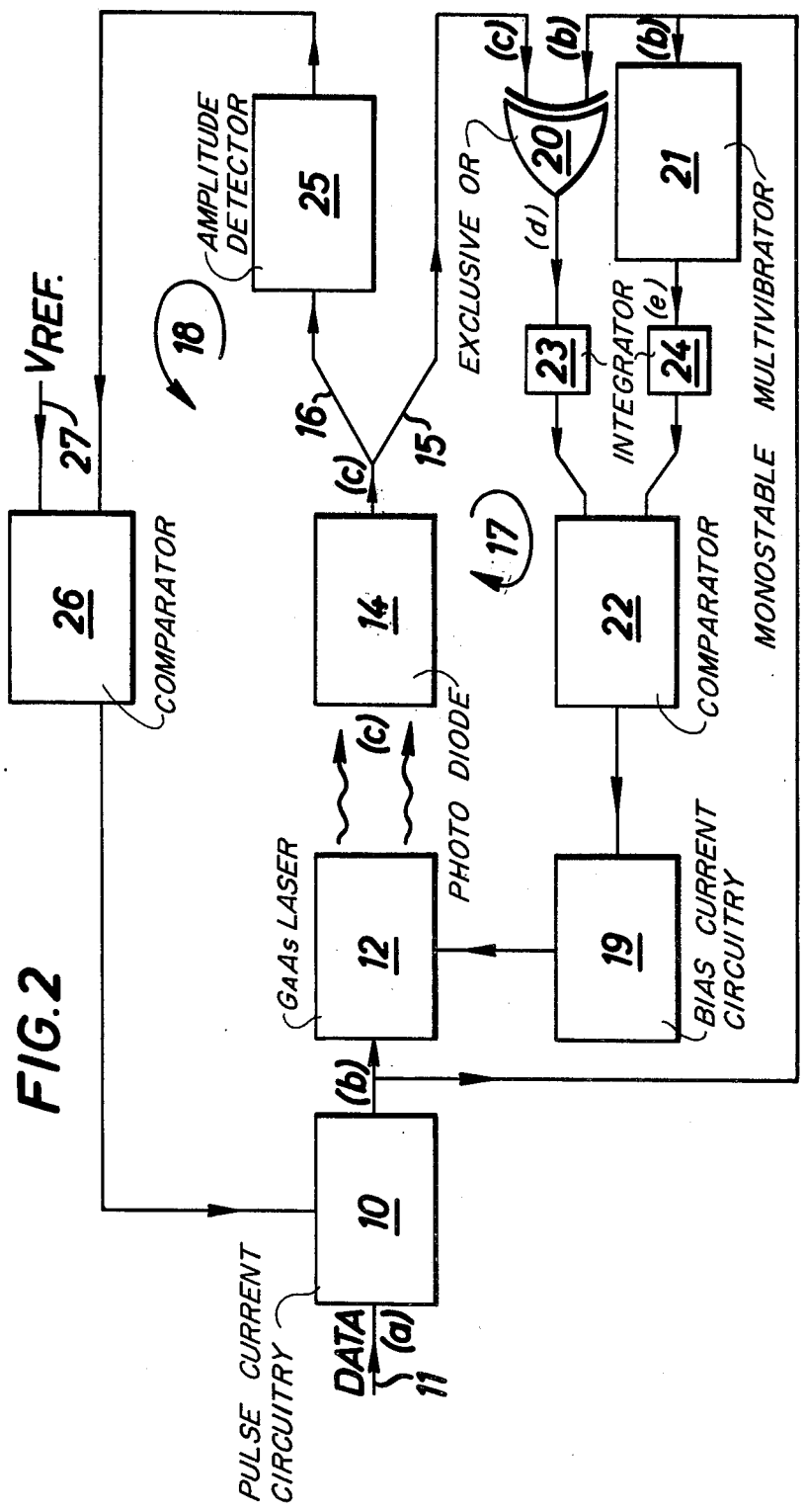
FIG. 2 is a block schematic diagram of control apparatus according to the invention.

A circuit for achieving this is shown in FIG. 2. The circuit has pulse current circuitry 10 which is arranged to receive a data stream at its input 11 and to convert this stream into drive pulses which drive a semiconductor (gallium arsenide) laser 12. A portion of the optical output of the laser 12 is received at a photodiode 14. The output of the photodiode 14 is amplified and fed to two outputs 15 and 16 which are connected via feedback loops 17 and 18 to bias current circuitry 19 and the pulse current circuitry 10, respectively. The output 15 is connected to one input of an exclusive OR gate 20. The second input to the exclusive OR gate is derived from the output of the pulse current circuitry 10.

The output of the exclusive OR gate 20 is connected to an integrator 23, the output of which is connected to one input of a comparator 22. The output of the circuitry 10 is also connected to the input of a monostable multivibrator 21. The output of the multivibrator 21 is connected to an integrator 24 the output of which forms a second input to the comparator 22. The output of the comparator 22 is connected to the bias current circuitry 19.

The output 16 is connected to the input of an amplitude detector 25, the output of which forms one input of a comparator 26. The second input to the comparator 26 is a reference voltage on the line 27. The output of the comparator 26 is fed to the circuitry 10.

Figure 3:
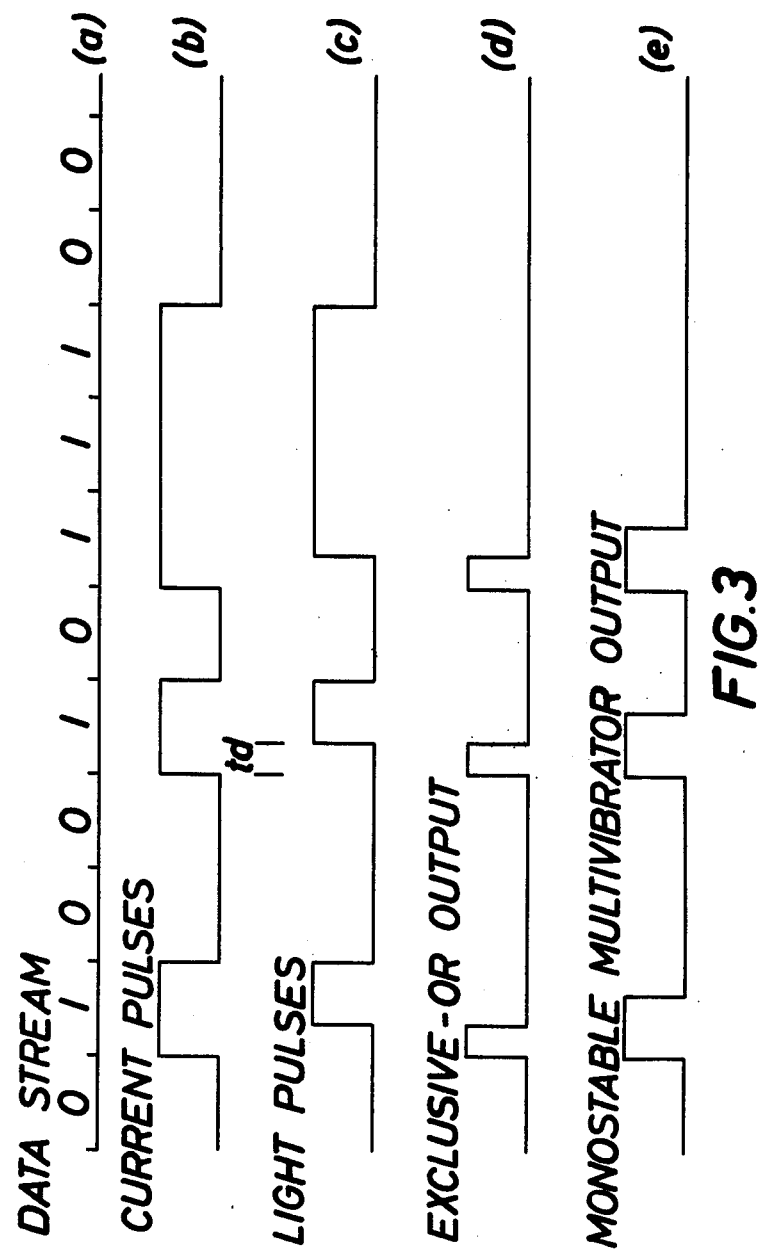
FIG. 3 illustrates graphically the pulse trains existing at various parts of the control apparatus.

Referring now to FIG. 3, a data stream (a) applied to the pulse current circuitry 10 is converted into a pulse train shown in (b). The optical lasing pulses (c) from the semiconductor laser 12 are delayed by a time $t_d$ relative to the drive pulses (b). Accordingly the output of the exclusive OR gate 20 is a difference signal shown at (d).

The drive pulse train is also used to initiate a further pulse train in the monostable multivibrator 21 the output of which for the data stream of (a) is shown at (e).

The pulse trains (d) and (e) are compared at a comparator 22 following long term integration by the integrators 23 and 24. If the difference between the two signals differs from a value corresponding to a predetermined "switch-on delay", a compensating signal is applied to the bias current circuitry 9 whereby the d.c. bias is adjusted in such a way as to restore the delay to its predetermined value.

When the pulses from the exclusive OR gate are fed through the integrator 23, the resulting output is a d.c. voltage directly proportional to the pulse width and inversely proportional to pulse spacing. Because of the dependence on pulse spacing, the integrator output cannot be compared with a fixed reference level so the monostable multivibrator 21 is used to derive a fixed width pulse for every pulse present in (b). Thus its output (e) is similarly integrated by integrator 24 to produce a reference level dependent only on pulse spacing which is the same as the spacing of the switch-on delays of (d). The reference level derived in this way has the advantage that temperature effects on the circuitry can be made to cancel when the comparison between the two inputs to the comparator 22 is made.

Variations in the laser output pulse amplitude are corrected by the feedback loop 18. The photodiode 14 and the amplitude detector 25 are used to monitor the optical pulse amplitude of the laser 12 and comparison is made with a fixed reference level at the comparator 26. If any difference exists between the detected level and the reference voltage, the comparator 26 generates a control signal which is applied to the pulse circuitry 10, the pulse current circuitry being adjusted in such a way that the amplitude of the optical output pulses of the laser 12 remains constant. In an alternative embodiment (not illustrated), the exclusive OR gate 20 is replaced by a half exclusive OR, that is a gate having zero output unless A and only A has a non-zero output where A is the output of the photodiode 14. The use of a half exclusive OR has the advantage that the output A can be intentionally delayed with respect to pulses derived from the laser pulse current circuitry 10 so that the rise time requirements of the circuitry can be relaxed.

Figure 4:
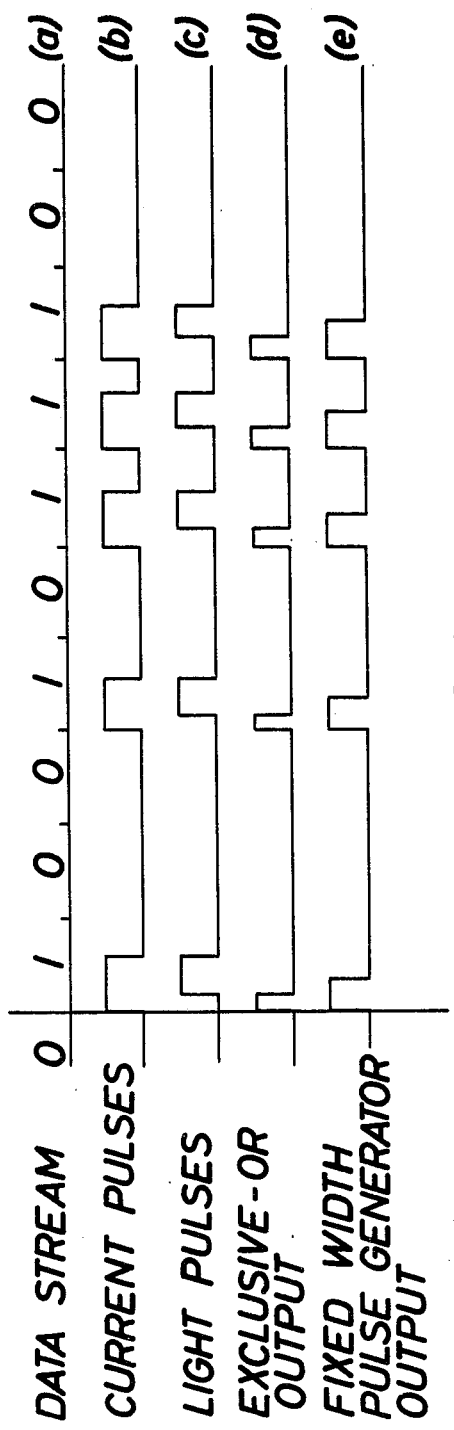
FIG. 4 illustrates graphically pulse trains similar to FIG. 3 for a different type of laser drive pulse train.

FIG. 3 illustrates the waveforms obtained when non-return to zero (NRZ) drive pulses are employed. The circuit shown in FIG. 2 can also operate with return to zero (RTZ) pulses. Waveforms corresponding to those of FIG. 3 for RTZ pulses are shown in FIG. 4.

In the circuit described with reference to FIG. 2 the switch-on delay is monitored. As an alternative it is possible to monitor the duration of the output pulses of the laser. In a circuit which operates in this way it is not necessary to use the exclusive OR gate. If the pulse duration is monitored the circuit is less complex and consumes less power.

Furthermore as an alternative to pulse amplitude it is possible to monitor mean pulse energy and to control the drive circuitry on the basis of the monitored mean pulse energy.

In the embodiment shown in FIG. 2 the photodiode 14 is a fast photodiode arranged to detect approximately 10% of the light transmitted from the laser. The output signal of the photodiode is relatively small and has to be amplified by a suitable amplifier.

The comparator 26 is an operational amplifier which compares the output voltage of the amplitude detector 25 with a reference voltage. It is assumed that when the feedback loop 18 is in equilibrium there is a very small voltage difference at the input to the comparator 26 which difference is amplified to produce a non-zero voltage which sets the current gain of the pulse current circuitry 10. The detector 25 can be a conventional diode and capacitor arrangement.

The monostable 21 is constructed from OR and NOR gates.

The integrators 23 and 24 are operational amplifiers with capacitative feedback. The output of each integrator is a d.c. voltage proportional to the mean energy in the pulse train at its input.

The comparator 22 is an operational amplifier and operates in a manner similar to the comparator 26. At equilibrium there is a very small voltage difference between its inputs and this difference is amplified to produce a non-zero voltage which is used to control the bias current circuitry 19. The bias current circuitry can be a conventional laser control providing a voltage controlled bias current for the laser.

What we claim is:

1. Apparatus for stabilizing output characteristics of an injection laser which has current supply means for supplying a d.c. bias current to the laser and drive circuitry for supplying current pulses to the laser, said apparatus comprising a detector for detecting a portion of the light output of the laser, said detector being arranged to convert the optical pulse train emitted by the laser into an electrical pulse train, first means for deriving from said electrical pulse train a first electrical signal whose magnitude is dependent upon the switch-on delay of the laser, second means for producing a reference second electrical signal, comparing means for comparing said first and second electrical signals to produce a control signal which is applied to said current supply means, the current supply means being responsive to said control signal to adjust the d.c. bias level to maintain the switch-on delay substantially constant.

2. Apparatus as claimed in claim 1 wherein said first means is arranged to produce a signal indicative of the difference in duration between the pulses of said electrical pulse train and the pulses of the laser drive pulse train, and said comparing means compares the magnitude of said signal with that of said reference signal to produce said control signal.

3. Apparatus as claimed in claim 1 wherein said detector is a photodiode.

4. Apparatus as claimed in claim 2 wherein said first means includes an exclusive or half-exclusive OR gate response to said electrical pulse train and said drive pulse train to produce said difference signal.

5. Apparatus as claimed in claim 4 wherein said second means includes a fixed width pulse generator which is responsive to said drive pulse train.

6. Apparatus as claimed in claim 5 wherein said fixed width pulse generator is a monostable multivibrator.

7. Apparatus as claimed in claim 6, including first integration means connected to integrate said difference signal and second integration means connected to integrate the output of said fixed width pulse generator.

8. Apparatus as claimed in claim 1, including a feedback loop connected between said detector and said drive circuitry for controlling the amplitude of said drive pulses, said feedback loop including means for detecting the amplitude of output pulses from said detector and a comparator for comparing a voltage corresponding to the detected amplitude with a reference voltage, said comparator output being connected to said pulse current circuitry, so that the comparator output signal is used to control the pulse current circuitry to stabilize the amplitude of the output pulses of the laser.

9. Apparatus as claimed in claim 1, including a feedback loop connected between said detector and said drive circuitry for controlling said drive pulses, said feedback loop including a means for detecting the mean energy of the output pulses from said detector and a comparator for comparing a voltage corresponding to the detected energy with a reference voltage, said comparator output being connected to pulse current circuitry, so that the comparator output signal is used to control the pulse current circuitry to stabilize the mean energy of the output pulses of the laser.

10. A control system for stabilizing output characteristics of an injection laser, said system including two feedback loops, first means common to said loops for producing an electrical pulse train analog of an optical pulse train emitted by the laser, the first loop further including second means connected to receive said electrical pulse train and to compare a signal proportional to the duration of said pulses with a fixed duration reference signal to produce a control signal, and means for feeding the control signal to d.c. bias control means of the laser, the d.c. bias control means being responsive to said control signal to adjust the d.c. bias level such that the optical output pulses of the laser are of fixed duration; said second loop further comprising a detector for detecting a parameter of the output pulses from said first means and control means responsive to said detector output to control the pulse current drive circuitry of the laser such that the corresponding parameter of the optical output pulses is maintained constant.

11. A method for stabilising output characteristics of an injection laser comprising deriving an electrical pulse train analog of an optical pulse train emitted by said laser, comparing a signal indicative of the duration of said pulses of said train with a fixed duration reference signal to produce a control signal, and controlling the d.c. bias applied to said laser by said control signal so that the duration of said optical output pulses is maintained constant.

12. A method as claimed in claim 11, wherein said signal represents the difference in duration between a pulse of the electrical pulse train and a pulse of the drive pulse train of the laser.

13. A method as claimed in claim 12 including the steps of detecting a parameter of pulses in said electrical pulse train, comparing the detected parameter with a reference signal to produce a feedback signal for controlling pulse current circuitry of the laser whereby the corresponding parameter of the optical output pulses is maintained constant.

* * * * *